United States Patent
Lee

(10) Patent No.: US 8,004,439 B2
(45) Date of Patent: Aug. 23, 2011

(54) DIGITAL TO ANALOG CONVERTER

(75) Inventor: Ching-Chung Lee, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 0 days.

(21) Appl. No.: 12/627,292

(22) Filed: Nov. 30, 2009

(65) Prior Publication Data

US 2011/0128174 A1     Jun. 2, 2011

(51) Int. Cl.
*H03M 1/66* (2006.01)
(52) U.S. Cl. .................. 341/144; 341/145; 341/154
(58) Field of Classification Search .................. 341/144, 341/145, 154, 153, 120
See application file for complete search history.

(56) References Cited

U.S. PATENT DOCUMENTS

| | | | | |
|---|---|---|---|---|
| 5,126,740 A * | 6/1992 | Kawada | | 341/144 |
| 5,633,637 A * | 5/1997 | Noro | | 341/144 |
| 5,668,553 A * | 9/1997 | Ashe | | 341/154 |
| 6,191,720 B1 * | 2/2001 | Zhang | | 341/145 |
| 6,724,336 B2 * | 4/2004 | Leung et al. | | 341/145 |
| 7,006,027 B2 * | 2/2006 | Lan et al. | | 341/144 |
| 7,411,536 B1 * | 8/2008 | Chen et al. | | 341/144 |
| 2002/0121995 A1 * | 9/2002 | Tabler | | 341/145 |
| 2007/0096965 A1 * | 5/2007 | Gillespie et al. | | 341/144 |

* cited by examiner

*Primary Examiner* — Jean B Jeanglaude
(74) *Attorney, Agent, or Firm* — Thomas|Kayden

(57) ABSTRACT

A digital to analog converter with two outputs controlled by an input signal with n-bits is disclosed. A reference voltage circuit generates $(2^n+1)$ reference voltages numbered from 1 to $(2^n+1)$. A switch array coupled to the reference voltage circuit, a first output terminal, and a second output terminal, includes a plurality of switches switching according to the input signal. The first output terminal outputs only one of odd reference voltages according to the input signal, and the second output terminal outputs one of even reference voltages according to the input signal, and the number of the switches is less than $(n \times 2^n + 2^n)$.

10 Claims, 5 Drawing Sheets

DIGITAL TO ANALOG CONVERTER

BACKGROUND OF THE INVENTION

1. Field of the Invention

The invention relates to a digital to analog converter, and more particularly to a digital to analog converter with reduced number of switches.

2. Description of the Related Art

Digital to analog converters are widely used in mixed-mode systems where the converter acts as an interface between the digital signal processing and analog signal processing components of mixed-mode systems.

FIG. 1 is a circuit diagram of a conventional $2^3$-to-2 digital to analog converter. The converter is controlled by a 3-bits input signal, and the output voltages V0 and V1 are determined according to the input signal. The converter requires $3 \times 2^3 + 2^3$ switches for implementation. In other words, a conventional $2^N$-to-2 digital to analog converter requires $N \times 2^N + 2^N$ switches for implementation. If N is 10, the number of digital to analog converters is large and the layout area accordingly is large.

FIG. 2 is a schematic diagram of a general architecture of a two stage N to 1 digital to analog converter. The two stage digital to analog converter comprises a first digital to analog converter (DAC) 21 controlled by (n−2) bits and a second stage with four switches controlled by the LSB (least significant bit) 2 bits. The DAC 21 outputs two voltages according to the most (n−2) bits, and then the LSB 2 bits control the four switches to output the output voltage Vout. The traditional architecture DAC 21 requires a large number of switches and this occupies large layout area. Therefore, the invention provides architectures of DACs that require fewer switches.

BRIEF SUMMARY OF THE INVENTION

An embodiment of the invention provides a digital to analog converter with two outputs controlled by an input signal with n-bits, comprising a reference voltage circuit generating ($2^n+1$) reference voltages numbered from 1 to ($2^n+1$); a first output terminal; a second output terminal; a switch array, coupled to the reference voltage circuit, the first output terminal, and the second output terminal, comprising a plurality of switches switching according to the input signal, wherein the first output terminal outputs only one of odd reference voltages according to the input signal, the second output terminal outputs one of even reference voltages according to the input signal, and the number of the switches is less than ($n \times 2^n + 2^n$)

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
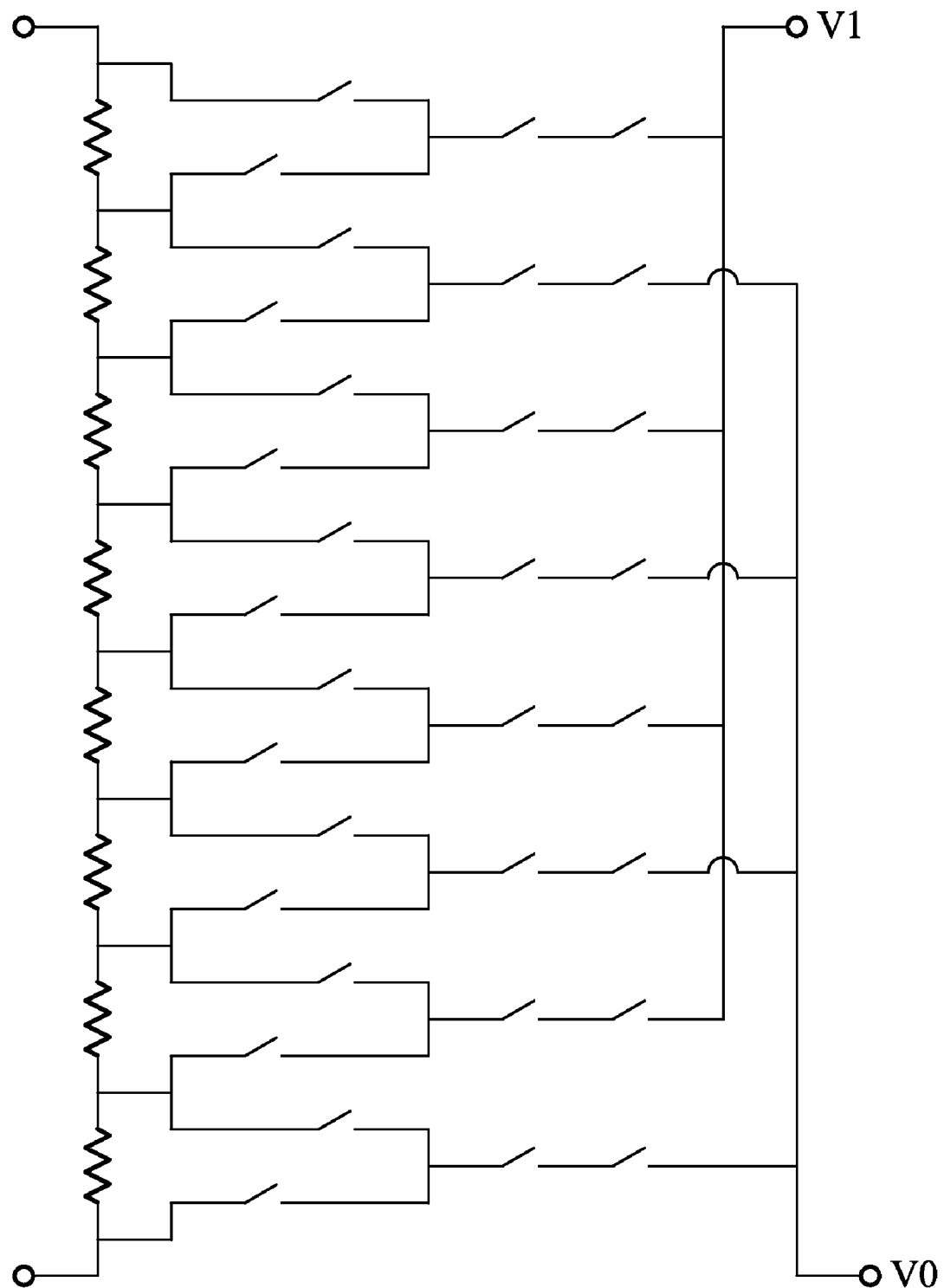
FIG. 1 is a circuit diagram of a conventional $2^3$-to-2 digital to analog converter.
Figure 2:
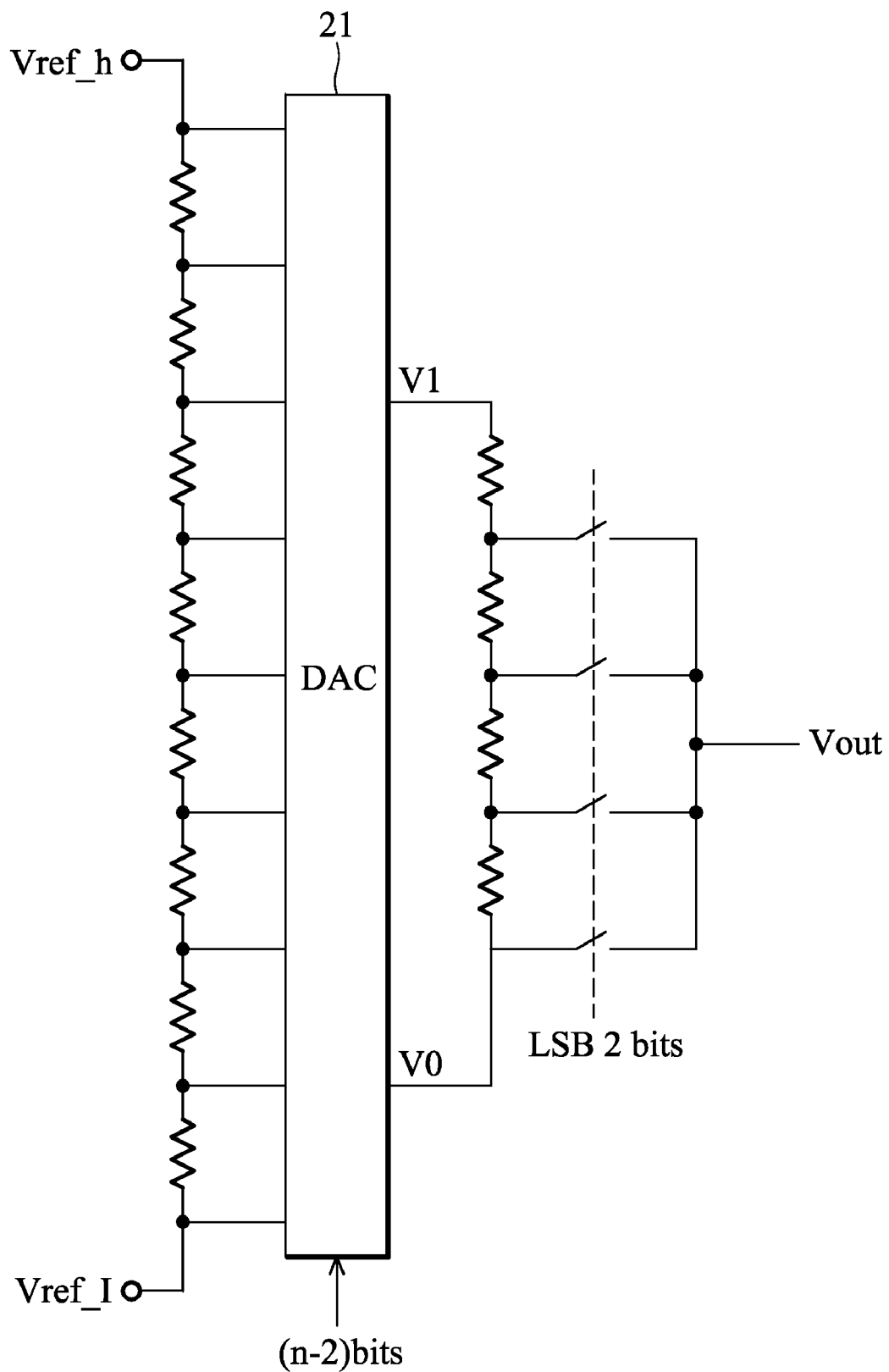
FIG. 2 is a schematic diagram of a general architecture of a two stage N to 1 digital to analog converter.
Figure 3:
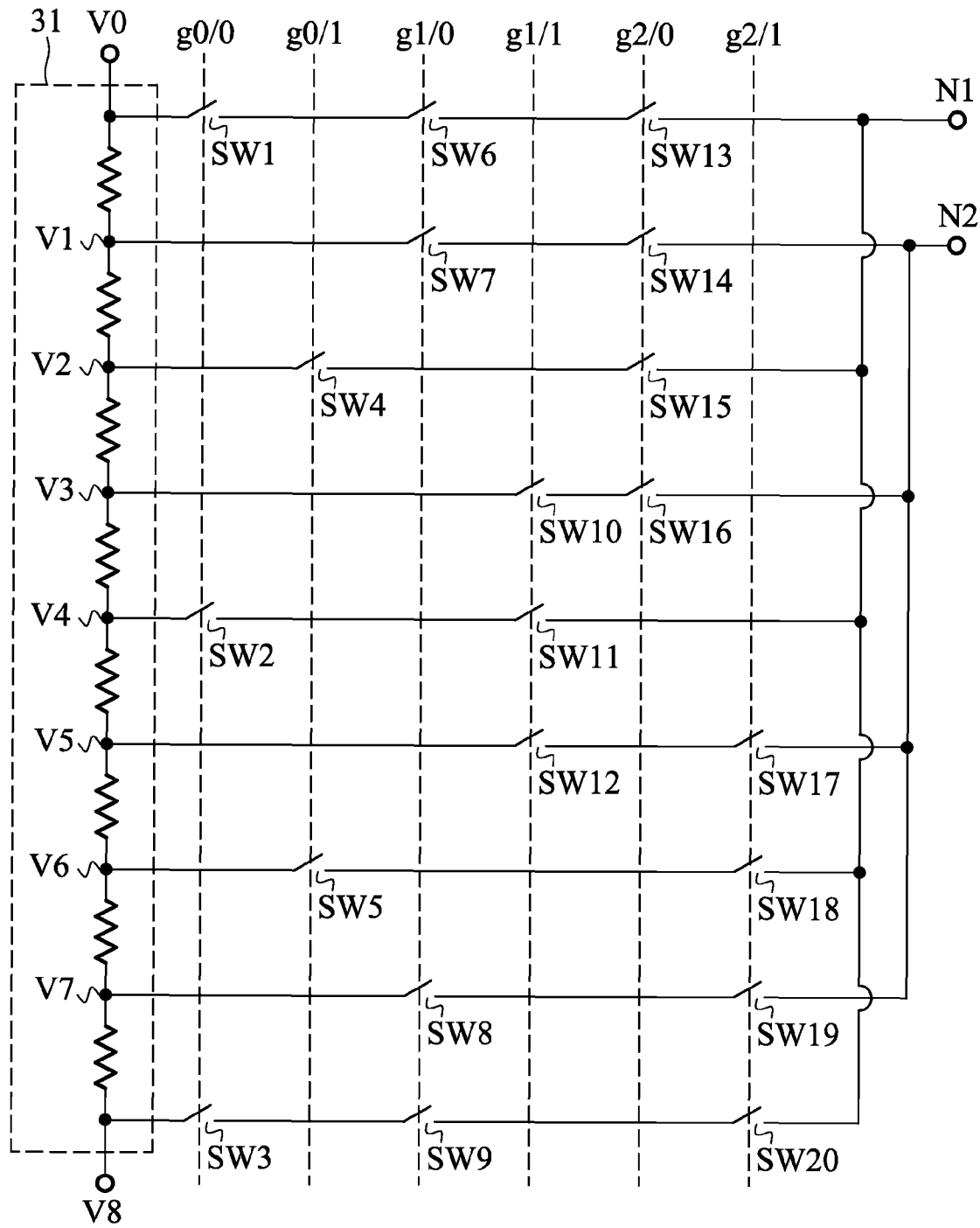
FIG. 3 is a schematic diagram of an embodiment of a digital-to-analog converter according to the invention.

FIG. 3 is a schematic diagram of an embodiment of a digital-to-analog converter according to the invention. The detailed circuit connection is not described here for brevity. The reference voltage circuit 31 generates ($2^3+1$) reference voltages numbered from 1 to ($2^3+1$). In an embodiment of the invention, the reference voltage circuit 31 comprises a plurality of resistors connected between a first voltage terminal providing the reference voltage V0 and a second voltage terminal providing the reference voltage V8 in serial, where the connection points of the resistors provides the reference voltages V1-V7. In an embodiment of the invention, voltage levels are increased in the sequence of the reference voltages V0-V8 when the reference voltage V8 exceeds the reference voltage V0, and are decreased in the sequence of the reference voltages V0-V8 when the reference voltage V0 exceeds the reference voltage V8.

In the following description, the first reference voltage V0, the third reference voltage V2, the fifth reference voltage V4, the seventh reference voltage V6, and the ninth reference voltage V8 are classified as odd reference voltages, and the second reference voltage V1, the fourth reference voltage V3, the sixth reference voltage V5, and the eighth reference voltage V7 are classified as even reference voltages. The switches in FIG. 3 are controlled by an input signal. In an embodiment of the invention, the input signal can be a gray coded signal, which is a binary numeral system where two successive values differ in only one bit. The input signal comprises three bits g0, g1 and g2. In FIG. 3, only the first reference voltage V0 and the last reference voltage V8 are controlled by all the three bits of the input signal, and only one of the reference voltages V0 and V8 is transmitted to the first output terminal N1. Furthermore, the middle reference voltages V1-V7 are controlled by two bits of the input signal. For example, the output of the second reference voltage V1, the fourth reference voltage V3, the sixth reference voltage V5 and the eighth reference voltage V7 are controlled by the bits g1 and g2 of the input signal, the output of the third reference voltage V2 and the seventh reference voltage V6 are controlled by the bits g0 and g2 of the input signal, and the output of the fifth reference voltage V4 is controlled by the bits g0 and g1 of the input signal. Moreover, in FIG. 3, all the even reference voltages, such as the second reference voltage V1, the fourth reference voltage V3, the sixth reference voltage V5, and the eighth reference voltage V7, are only controlled by the bits g1 and g2 of the input signal, and only one of them is transmitted to the second output terminal N2.

The switches SW1, SW2 and SW3 are turned on when the bit g0 is 0. The switches SW4 and SW5 are turned on when the bit g0 is 1. The switches SW6, SW7, SW8 and SW9 are turned on when the bit g1 is 0. The switches SW10, SW11 and SW12 are turned on when the bit g1 is 1. The switches SW13, SW14, SW15 and SW16 are turned on when the bit g2 is 0. The switches SW17, SW18, SW19 and SW20 are turned on when the bit g2 is 1. As shown in FIG. 3, the number of the switches required in the $2^n$-to-2 digital to analog converter according to an embodiment of the invention is (($n \times 2^n$)−$2^n$+ n+1), which is less than (n×2ⁿ+2ⁿ) as required in the conventional 2³-to-2 digital to analog converter.

Figure 4:
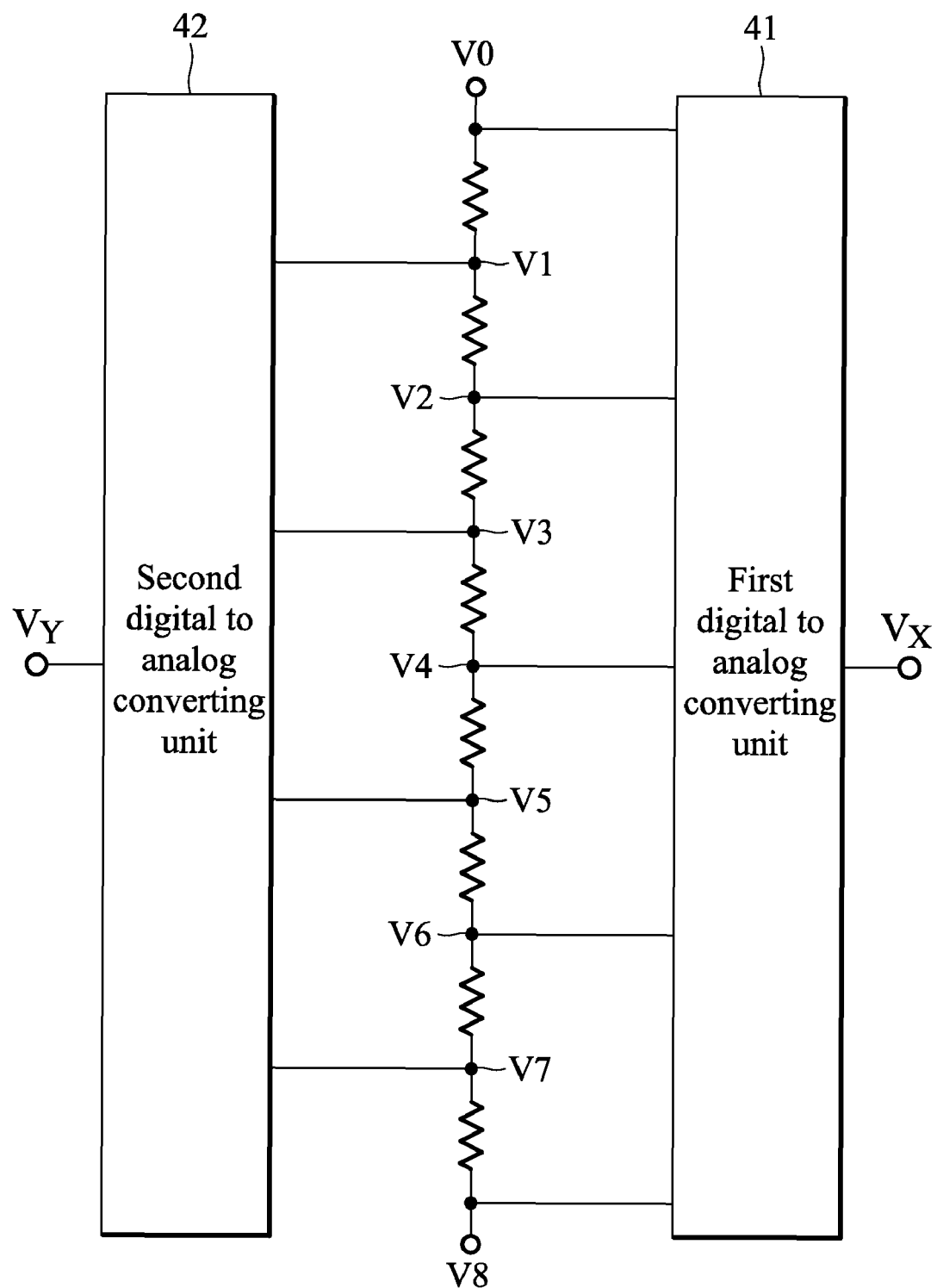
FIG. 4 is a schematic diagram of another embodiment of a digital-to-analog converter according to the invention.

FIG. 4 is a schematic diagram of another embodiment of a digital-to-analog converter according to the invention. The digital-to-analog converter comprises a first digital to analog converting unit 41, and a second digital to analog converting unit 42. The first digital to analog converting unit 41 receives and outputs one of the odd reference voltages. The second digital to analog converting unit 42 is controlled by the input signal except for the third bit of the input signal, to receive and output one of even reference voltages. In FIG. 4, the output voltage of the first digital to analog converting unit 41 is $V_X$, and the output voltage of the second digital to analog converting unit 42 is $V_Y$.

Figure 5:
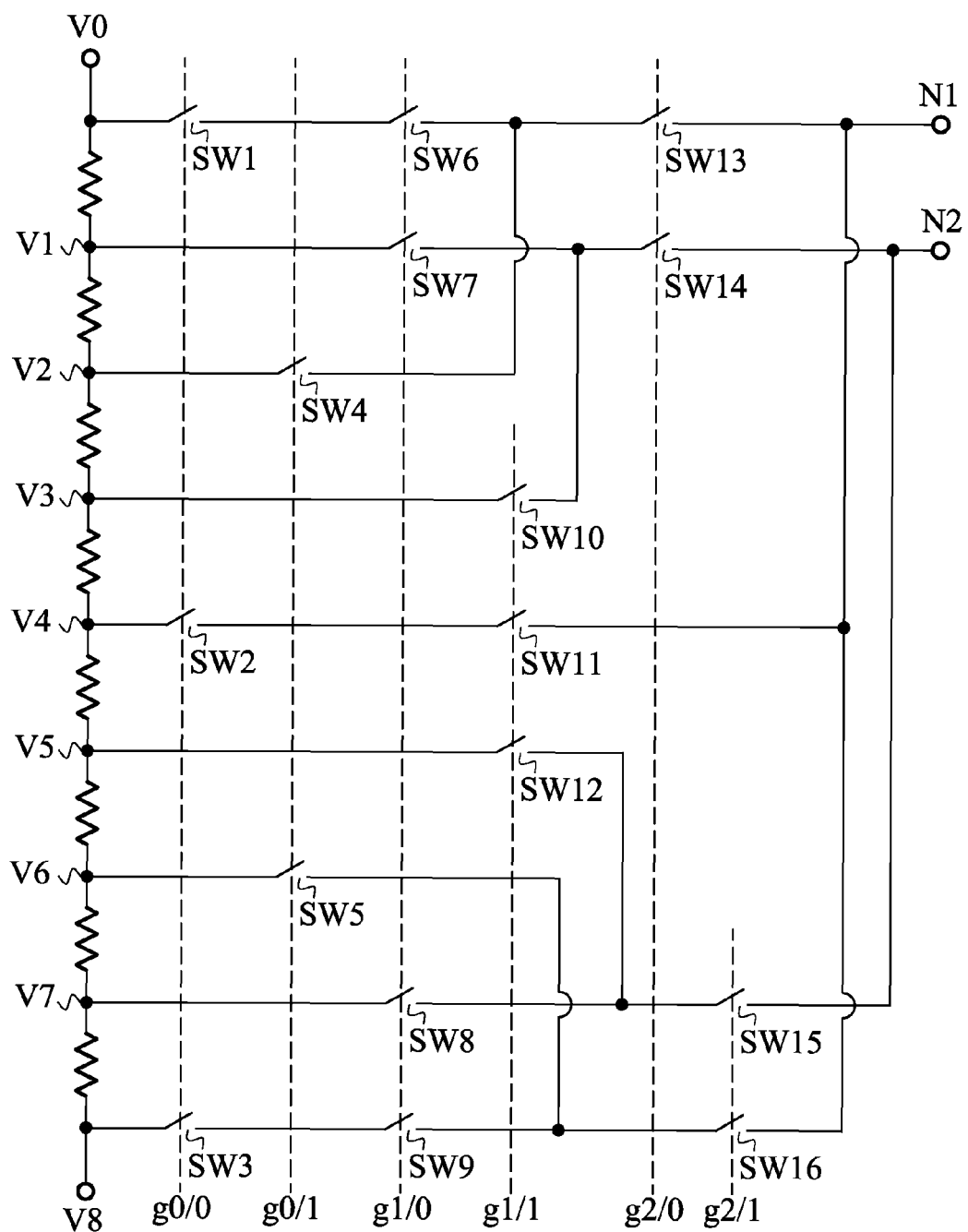
FIG. 5 is a schematic diagram of another embodiment of a digital-to-analog converter according to the invention.

FIG. 5 is a schematic diagram of another embodiment of a digital-to-analog converter according to the invention. Compared with the converter in FIG. 3, the circuit design of the converter in FIG. 5 can save more switches. The circuit design of FIG. 5 uses the binary tree architecture to implement a $2^3$ to 2 digital to analog converter. The switches in FIG. 3 are controlled by an input signal. The input signal comprises three bits, g0, g1 and g2. In FIG. 5, only the first reference voltage V0 and the last reference voltage V8 are controlled by all the three bits of the input signal, and only one of the reference voltages V0 and V8 is transmitted to the first output terminal N1. Furthermore, the middle reference voltages V1-V7 are controlled by two bits of the input signal. For example, the output of the fifth reference voltage V4 is controlled by the bits g0 and g1 of the input signal, the output of the third reference voltage V2 and the seventh reference voltage V6 are controlled by the bits g0 and g2 of the input signal, and the output of the second reference voltage V1, the fourth reference voltage V3, the sixth reference voltage V5 and the eighth reference voltage V7 are controlled by the bits g1 and g2 of the input signal. Moreover, in FIG. 5, all the even reference voltages, such as the second reference voltage V1, the fourth reference voltage V3, the sixth reference voltage V5, and the eighth reference voltage V7, are only controlled by the bits g1 and g2 of the input signal, and only one of them is transmitted to the second output terminal N2.

In an embodiment of FIG. 5, the output of the first reference voltage V0 and the third reference voltage V2 are determined by the switch SW13 directly connected to the first output terminal N1, and the output of the second reference voltage V1 and the fourth reference voltage V3 are determined by the switch SW14 directly connected to the second output terminal N2. In addition, the output of the sixth reference voltage V5 and the eighth reference voltage V7 are determined by the switch SW15 directly connected to the second output terminal N2, and the output of the seventh reference voltage V6 and the ninth reference voltage V8 are determined by the switch SW16 directly connected to the first output terminal N1.

In another embodiment of FIG. 5, the output of the first reference voltage V0 and the third reference voltage V2 are controlled by sharing the switch SW13 corresponding to the bit g2 of the input signal and the first output terminal N1, and the output of the second reference voltage V1 and the fourth reference voltage V3 are controlled by sharing the switch SW14 corresponding to the bit g2 of the input signal and the second output terminal N2. In addition, the output of the sixth reference voltage V5 and the eighth reference voltage V7 are controlled by sharing the switch SW15 corresponding to the bit g2 of the input signal and the second output terminal N2, and the output of the seventh reference voltage V6 and the ninth reference voltage V8 are controlled by sharing the switch SW16 corresponding to the bit g2 of the input signal and the first output terminal N1. As shown in FIG. 5, the number of the switches required in the $2^n$-to-2 digital to analog converter according to an embodiment of the invention using binary tree architecture is less than $((n \times 2^n) - 2^n + n + 1)$, saving the cost of the switches.

The switches SW1, SW2 and SW3 are turned on when the bit g0 is 0. The switches SW4 and SW5 are turned on when the bit g0 is 1. The switches SW6, SW7, SW8 and SW9 are turned on when the bit g1 is 0. The switches SW10, SW11 and SW12 are turned on when the bit g1 is 1. The switches SW 13 and SW 14 are turned on when the bit g2 is 0. The switches SW15 and SW16 are turned on when the bit g2 is 1. According to the design of FIG. 5, only 16 switches are required to implement a $2^3$ to 2 digital to analog converter. Table 2 shows the number of switches required to implement $2^N$ to 2 digital to analog converter by different designs.

TABLE 2

| Bits (n) | Number of Switches | | |
|---|---|---|---|
| | Conventional | FIG. 3 | FIG. 5 |
| 3 | 32 | 20 | 16 |
| 4 | 80 | 53 | 45 |
| 6 | 448 | 327 | 263 |
| 8 | 2304 | 1801 | 1545 |
| 10 | 11264 | 9227 | 8715 |
| 12 | 53248 | 45069 | 43021 |

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital to analog converter with two outputs, controlled by an input signal with n-bits, comprising:
a reference voltage circuit generating (2n+1) reference voltages numbered from 1 to (2n+1);
a first output terminal;
a second output terminal; and
a switch array, coupled to the reference voltage circuit, the first output terminal, and the second output terminal, comprising a plurality of switches switching according to the input signal, wherein the first output terminal outputs only one of odd reference voltages according to the input signal, the second output terminal outputs one of even reference voltages according to the input signal, and the number of the switches is less than (n×2ⁿ+2ⁿ).

2. The converter as claimed in claim 1, wherein the number of the switches is less than ((n×2ⁿ)−2ⁿ+n +1).

3. The converter as claimed in claim 1, wherein the input signal is a gray coded signal.

4. The converter as claimed in claim 1, wherein the output of only a first reference voltage and a (2n+1)th reference voltage are controlled by the n-bits of the input signal, and the output of other reference voltages are controlled by only (n−1) bits of the input signal.

5. The converter as claimed in claim 1, wherein reference voltage circuit comprises a plurality of resistors connected between a first voltage terminal and a second voltage terminal in serial, the first voltage terminal provides a first reference voltage, the second voltage terminal provides a ninth reference voltage, connection points of the resistors respectively provides a second reference voltage, a third reference voltage, a fourth reference voltage, a fifth reference voltage, a sixth reference voltage, a seventh reference voltage, and an eighth reference voltage, voltage levels are increased in a sequence of the first reference voltage, the second reference voltage, the third reference voltage, the fourth reference voltage, the fifth reference voltage, the sixth reference voltage, the seventh reference voltage, the eighth reference voltage, and the ninth reference voltage when the ninth reference voltage exceeds the first reference voltage.

6. The converter as claimed in claim 5, wherein the output of the first reference voltage and the ninth reference voltage are controlled by three bits of the input signal, the output of the second reference voltage, the fourth reference voltage, the sixth reference voltage and the eighth reference voltage are controlled by the second and third bit of the input signal, the output of the third reference voltage and the seventh reference voltage are controlled by the first and third bit of the input signal, and the output of the fifth reference voltage is controlled by the first and second bit of the input signal.

7. The converter as claimed in claim 5, wherein the output of the first reference voltage and the third reference voltage are determined by the switch directly connected to the first output terminal, and the output of the second reference voltage and the fourth reference voltage are determined by the switch directly connected to the second output terminal.

8. The converter as claimed in claim 5, wherein the output of the sixth reference voltage and the eighth reference voltage are determined by the switch directly connected to the second output terminal, and the output of the seventh reference voltage and the ninth reference voltage are determined by the switch directly connected to the first output terminal.

9. The converter as claimed in claim 5, wherein the output of the first reference voltage and the third reference voltage are controlled by sharing the switch corresponding to a predetermined bit of the input signal and the first output terminal, and the output of the second reference voltage and the fourth reference voltage are controlled by sharing the switch corresponding to the predetermined bit of the input signal and the second output terminal.

10. The converter as claimed in claim 5, wherein the output of the sixth reference voltage and the eighth reference voltage are controlled by sharing the switch corresponding to a predetermined bit of the input signal and the second output terminal, and the output of the seventh reference voltage and the ninth reference voltage are controlled by sharing the switch corresponding to the predetermined bit of the input signal and the first output terminal.

* * * * *